(12) United States Patent
Watanabe

(10) Patent No.: US 6,394,816 B1
(45) Date of Patent: May 28, 2002

(54) CONNECTING DEVICE FOR FLAT CIRCUIT

(75) Inventor: Hiroshi Watanabe, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/676,561

(22) Filed: Oct. 2, 2000

(30) Foreign Application Priority Data

Oct. 1, 1999 (JP) ............................................ 11-281601
Oct. 12, 1999 (JP) ............................................ 11-289592

(51) Int. Cl.$^7$ ................................................ H01R 9/09
(52) U.S. Cl. ........................................ 439/67; 439/595
(58) Field of Search ............................ 439/67, 595, 77, 439/498, 499

(56) References Cited

U.S. PATENT DOCUMENTS 5,709,554 A * 1/1998 Savage, Jr. ................... 439/56

FOREIGN PATENT DOCUMENTS

| JP | 10-342532 | 12/1998 |
| JP | 11-5316 | 1/1999 |

* cited by examiner

Primary Examiner—Renee Luebke
Assistant Examiner—Alexander Gilman
(74) Attorney, Agent, or Firm—Morgan, Lewis & Bockius LLP

(57) ABSTRACT

Flat circuits 8 and 9 have at least two layers provided thereon, a step is formed on ends of the flat circuits 8 and 9 having two or more layers, exposure windows 13 and 14 are provided on the flat circuits 8 and 9 in the vicinity of the step and conductive materials 11 and 12 are exposed to an outside, and metal terminals 20 and 21 of the connector 17 are electrically connected to the conductive materials 11 and 12 exposed to an inside of the exposure windows 20 and 21 through the fitting of the connector 17.

19 Claims, 9 Drawing Sheets

FIG. 2
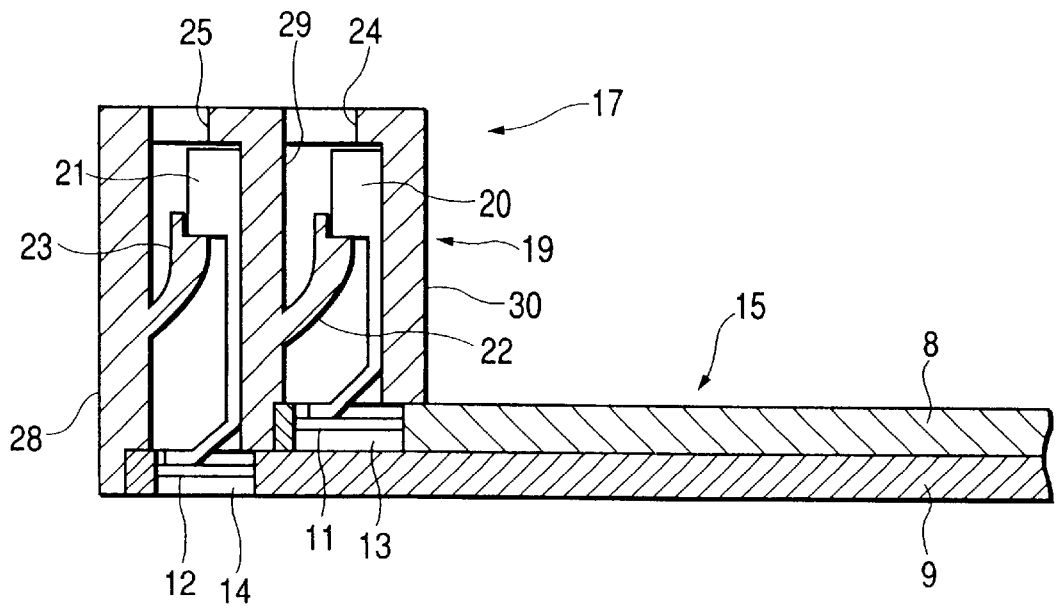
FIG. 3
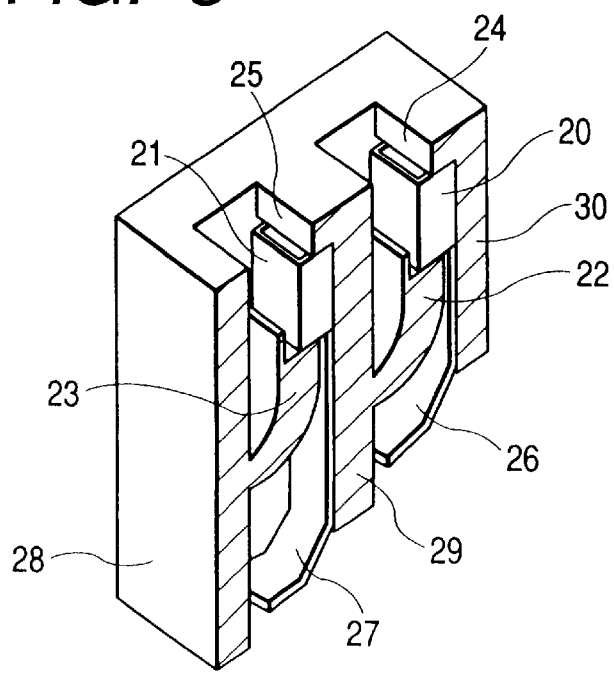
FIG. 4

CONNECTING DEVICE FOR FLAT CIRCUIT

BACKGROUND OF THE INVENTION

1. Technical Field

The present invention relates to an improvement in a connecting device for a flat circuit device to be used for automobiles and industrial machines.

2. Related Art

In recent years, various electrical apparatuses developed by a technique for enhancing the functions of vehicles have tended to be employed and mounted on automobile as represented by a navigation system and an air bag system, and have been demanded increasingly. Correspondingly, the number of wire harnesses provided in a body is increased. From the point of view of workability and effective utilization of an interior space, a so-called flat circuit 1, which is formed by converging and burying a conductor or conductive material 2 with an insulating resin and is elongated and flat, has been implemented as shown in FIG. 14.

The flat circuit 1 is provided, in some middle portions, with an exposure window 4 for extracting a current of a power supply, such as a battery of an automobile, such that a current can be supplied from proper portions, and is thus provided in a component of an instrument panel, for example. However, the number of the conductors or conductive materials to be provided is increased through an enhancement of the functions of the vehicle as described above. For this reason, the flat circuit 1 is correspondingly used by stacking a layer (two layers, in this case) through an adhesive or fastening means 3.

In a conventional apparatus, as shown in FIG. 14, in the case that an end of the flat circuit 1 is cut and a supply current is taken out therefrom, another conductor or conducting material 5 is electrically connected to the conductor or conductive material 2 facing the exposure window 4 on the end side and a metal terminal (not shown) attached to the end of the conductor or conductive material 5 is inserted in and connected to one of sides of a connector housing 6. A metal terminal (not shown) on a harness end for various apparatuses such as a wiper motor, traveling instruments or an audio system is connected to the other side of the connector housing 6.

In the conventional device, an electric wire 2 of each layer is connected through the conductive material 5. Therefore, there is a high possibility that the conductive materials 5 might come in contact with each other before reaching the connector housing 6. Furthermore, the metal terminal on the conductive material 5 side comes in contact with that of the harness on the electrical device side in two portions of the connector housing 6. Thus, the number of the contact portions is increased correspondingly so that connecting reliability might be deteriorated.

Since each flat circuit 1 has such a structure that layers are provided without a clearance with an adhesive, the conductor or conductive material cannot be connected from the conductor or conductive material facing the exposure window in the middle of the lower flat circuit. Moreover, if the conductor or conductive material is to be electrically connected from the lower flat circuit, it is connected at the end of the flat circuit as shown in FIG. 14. The conductors or conductive materials 2 for the layers are connected to each other by using the conductors or conductive materials 5. Therefore, there is a high possibility that the conductors or conductive materials 5 might come in contact with each other before they reach the connector housing 6. Moreover, there are three nodes in total between the conductor or conductive material 2 and the conductor or conductive material 5 in the flat circuit and between the conductor or conductive material and the metal terminal and between the metal terminal and a metal terminal of a harness on the electrical device side in the connector housing 6. Thus, the number of the contacts is increased correspondingly. Consequently, connecting reliability might be deteriorated.

SUMMARY OF THE INVENTION

The invention has been devised in consideration of the circumstances and has an object to obtain a flat circuit device capable of supplying a supply current from a multilayered flat circuit with connecting reliability maintained.

In order to solve the problem, according to the present invention, there is provided a flat circuit device in which a connector is fitted and connected, in an almost vertical direction, into a flat-shaped flat circuit in which a conductive material is wired in parallel and is buried with an insulating material, the flat circuit has at least two layers provided thereon, a step is formed on an end of the flat circuit having two or more layers, an exposure window is provided on the flat circuit in the vicinity of the step and the conductive material is exposed to an outside, and a metal terminal of the connector is electrically connected to the conductive material exposed to an inside of the exposure window through the fitting of the connector.

In the flat circuit device of the present invention, the connector is formed such that a plurality of metal terminals are accommodated in a connector housing thereof and an end of the metal terminal has a length varied corresponding to the step.

In the flat circuit device of the present invention, the connector housing is formed such that an end face opposed to the step of the flat circuit is step-shaped corresponding to the step.

In the flat circuit device of the present invention, the metal terminal of the connector housing has an end formed elastically deformably and the metal terminal elastically comes in contact with the conductive material exposed to the inside of the exposure window against spring force of the metal end during the fitting of the connector.

In the flat circuit device of the present invention, the end of the metal terminal of the connector housing is welded and connected to the conductive material exposed to the inside of the exposure window.

In the flat circuit device of the present invention, the connector is constituted such that the connector housing is divided corresponding to the flat circuit and the connector housing corresponding to the step is integrated to be fitted and bonded into the flat circuit.

According to the invention, the flat circuit has at least two layers provided thereon, a step is formed on an end of the flat circuit having two or more layers, an exposure window is provided on the flat circuit in the vicinity of the step and the conductive material is exposed to an outside, and a metal terminal of the connector is electrically connected to the conductive material exposed to an inside of the exposure window through the fitting of the connector. Therefore, the number of electric nodes is decreased and the conductive material is directly connected from the lower layers of a multilayered circuit.

According to the invention, the connector is formed such that a plurality of metal terminals are accommodated in the housing thereof and an end of the metal terminal has a length varied corresponding to the step. Therefore, it is possible to easily attach the connector to a portion where the terminal of the multilayered flat circuit is stepped.

According to the invention, the connector housing is formed such that an end face opposed to the step of the flat circuit is step-shaped corresponding to the step. Therefore, the connector can be stably fitted in the multilayered flat circuit.

According to the invention, the metal terminal elastically comes in contact with the conductive material exposed to the inside of the exposure window against spring force of the metal terminal during the fitting of the connector. Consequently, electric connection can be carried out reliably.

According to the invention, the end of the metal terminal of the connector housing is welded and connected to the conductive material exposed to the inside of the exposure window. Consequently, reliable electric connection can be obtained.

According to the invention, the connector is constituted such that predetermined connector housings are integrated with each other and fitted in the flat circuit corresponding to the number of the stacked layers of the flat circuit.

The present invention has been devised in consideration of the circumstances and has an object to obtain a connecting device for a flat circuit capable of branching a circuit in the middle of the multilayered flat circuit.

In order to solve the problem, according to the present invention, there is provided a flat circuit device in which an exposure window for exposing a conductor or conductive material is formed on a flat-shaped flat circuit having the conductor or conducting material wired in parallel and buried with an insulating material, a connector housing accommodating a terminal capable of being directly connected is attached to the conductor or conductive material exposed through the exposure window, the flat circuit is multilayered to have two or more layers and a terminal of the connector housing is individually connected to the conductor or conductive material exposed through the exposure window formed for each layer of the flat circuit, and the flat circuit of each layer having the connector housing attached thereto is further integrated by a connecting mechanism.

In the flat circuit device of the present invention, the connector housing is protruded outward from a side surface of the flat circuit and is provided such that a fitting portion on the other side capable of being connected to a circuit on the other side is exposed to a protruded end.

In the flat circuit device of the present invention, the connecting mechanism is formed by an engagement projection provided on the flat circuit and an engagement hole to be fitted therein, and adjacent flat circuits are bonded through fitting of the engagement projection in the engagement hole.

In the flat circuit device of the present invention, the connecting mechanism is formed by a locking portion provided in the connector housing and a locked portion to be fitted therein, and the adjacent connector housings are bonded to each other through fitting of the locking portion in the locked portion.

In the flat circuit device of the present invention, the protruded end of the connector housing is set to be placed in such a position that it is bent at a predetermined angle with respect to a flat face of the flat circuit.

According to the invention, the flat circuit is multilayered to have two or more layers and a terminal of the connector housing is individually connected to the conductor or conductive material exposed through the exposure window formed for each layer of the flat circuit, and the flat circuit of each layer having the connector housing attached thereto is further integrated by a connecting mechanism. Therefore, an electric circuit can be taken out from the middle portion of the lower flat circuit.

According to the invention, the connector housing is protruded outward from a side surface of the flat circuit and a fitting portion on the other side capable of being connected to a circuit on the other side is exposed to a protruded end. Therefore, other circuits and auxiliary machines can easily be fitted without the disturbance of the flat circuit.

According to the invention, the connecting mechanism is provided on the flat circuit. Therefore, the flat circuits are integrated, connecting reliability is enhanced and the whole connecting device is made small-sized.

According to the invention, the connecting mechanism is also provided in the connector housing. Therefore, the flat circuit and the connector housing are wholly integrated strongly.

According to the invention, the protruded end of the connector housing is inclined with respect to the flat face of the flat circuit. Therefore, a connector housing having the best inclination is selected for use depending on the position and direction in which the circuit on the other side is to be attached.

BRIEF DESCRIPTION OF THE DRAWINGS

FIG. 2 is an enlarged longitudinal sectional view showing the state of assembly of the flat circuit device taken along the line II—II in FIG. 1.

FIG. 3 is an enlarged sectional view showing the main part of a connector 17 illustrated in FIG. 2.

FIG. 4 is a side view showing a terminal to be accommodated in the connector 17.

DETAILED DESCRIPTION OF PREFERRED EMBODIMENT

First Embodiment

Figure 1:
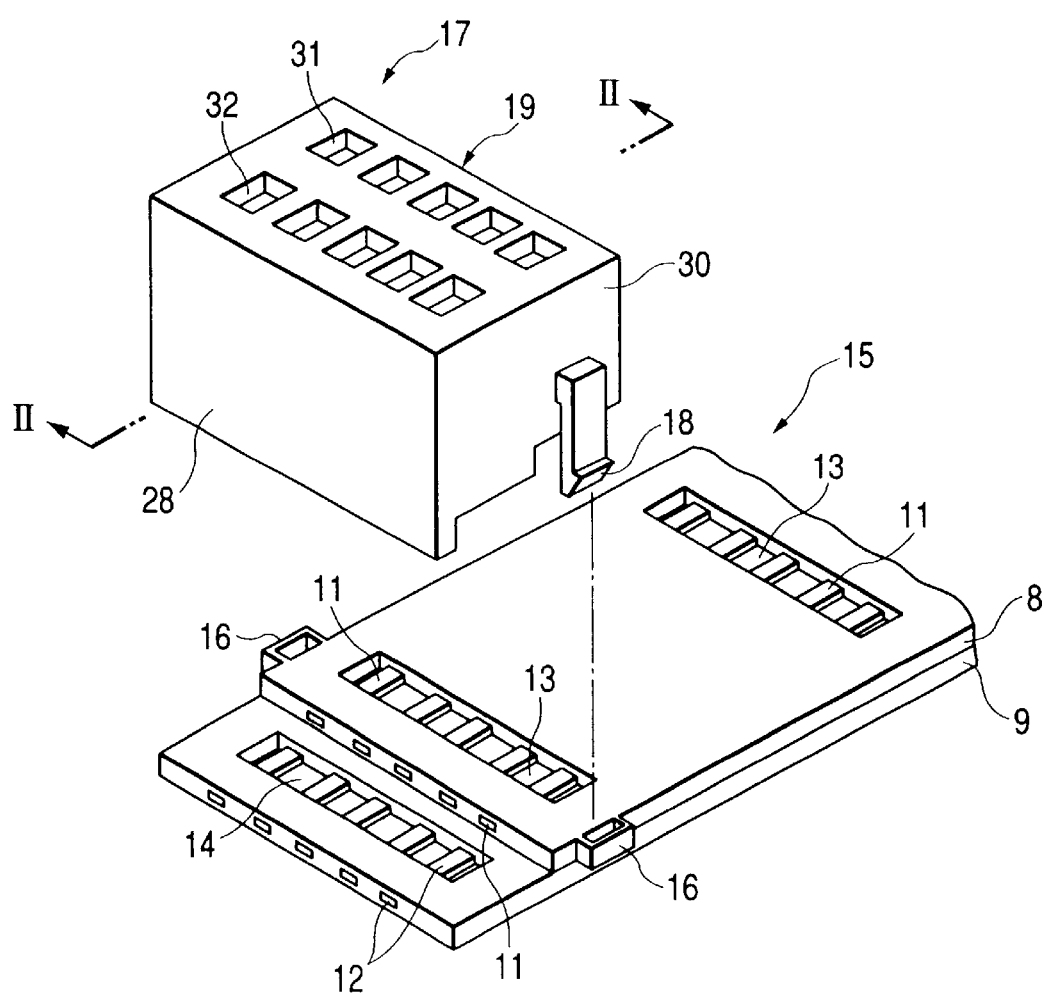
FIG. 1 is an exploded view showing a flat circuit device according to a first embodiment of the invention.

A first embodiment of the invention will be described with reference to FIGS. 1 to 5. FIG. 1 is an exploded view showing a flat circuit device, FIG. 2 is an enlarged longitudinal sectional view showing the flat circuit device taken along the line II—II in FIG. 1, and FIG. 3 is an enlarged sectional view showing the main part of a connector 17 illustrated in FIG. 2.

First of all, the reference numerals 8 and 9 denote flat circuits in which a plurality of (five in the present embodiment) plate-shaped conductive materials 11 and 12 as circuits are buried in an insulating resin material. The flat circuits 8 and 9 are formed into elongated and flat shapes and are integrated into two layers through an adhesive or proper bonding method. The flat circuits are provided with exposure windows 13 and 14 for exposing the conductive materials 11 and 12 to the outside in appropriate portions in a longitudinal direction such that a battery current can be extracted. The exposure windows 13 and 14 are provided in a plurality of portions in the longitudinal direction of the flat circuits 11 and 12. The flat circuits 11 and 12 are cut and the portions thus cut are integrated stepwise into two vertical layers with an adhesive. The thus flat circuits 11 and 12 will be hereinafter referred to as a "two-layered circuit 15". The two-layered circuit 15 gives bending deformation according to the shape of the body structure of an automobile and can be bent and provided. The reference numeral 16 denotes an engagement hole for engagement with an engagement click 18 of a connector 17.

Next, the connector 17 will be described. A housing 19 of the connector 17 is formed of a well-known synthetic resin and is provided stepwise in conformity with the shape of the stepped portion of the two-layered circuit 15. A terminal 20 having a shorter leg and a terminal 21 having a longer leg which are plate-shaped and formed of a metal are accommodated in the housing 19. Each of the terminals 20 and 21 is inserted from below the housing 19. At this time, lances 22 and 23 are forcibly deformed elastically counterclockwise as shown in FIG. 3). The terminals 20 and 21 are held between upper opening edges 24 and 25 and the lances 22 and 23. A part of each of the legs 26 and 27 of the terminals 20 and 21 is curved and extended to face the outside from the housing 19. The leg 26 can be electrically connected to the conductive material 11 of the upper flat circuit 8. The leg 27 can be electrically connected to the conductive material 12 of the lower flat circuit 9. The legs 26 and 27 are curved such that the connector 17 comes in contact with the conductive materials 11 and 12 elastically or by pressure through elastic deformation when the connector 17 is fitted in the two-layered circuit 15.

Figure 5:
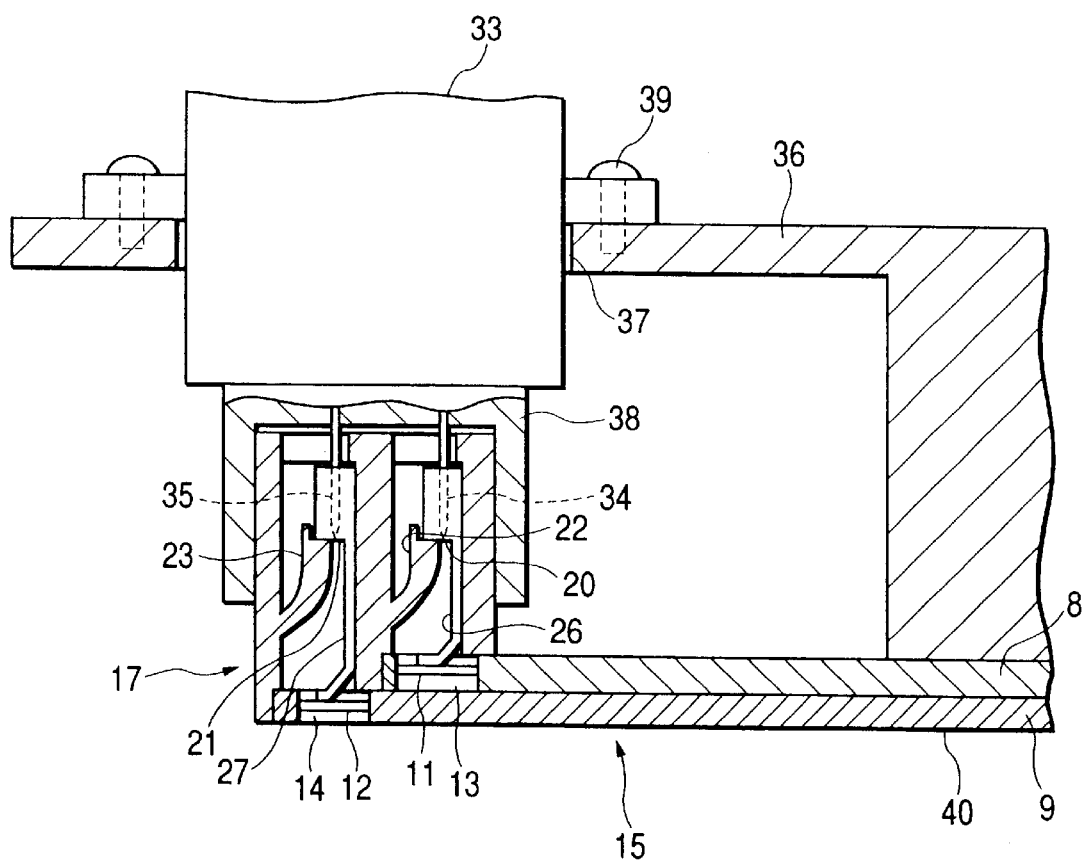
FIG. 5 is a sectional view showing the state in which the flat circuit device is attached to an instrument panel.

As shown in FIG. 2, a left wall 28 of the housing 19 is formed to cover the cut end face of the lower flat circuit 9 during connector fitting. An intermediate wall 29 is formed to abut mainly on the cut end face of the upper flat circuit 8. A right wall 30 is formed to abut on the vicinity of the exposure window 13 of the upper flat circuit 8. The reference numerals 31 and 32 denote terminal inserting ports. Metal terminals 34 and 35 of an electrical device 33 on the other side are respectively inserted in the terminal inserting ports 31 and 32 as shown in FIG. 5.

Thus, the terminals 20 and 21 are provided in the housing 19 corresponding to the positions of the conductive materials 11 and 12.

Consequently, the flat circuit device is constituted by fitting the connector 17 having the above-mentioned structure in the exposure windows 13 and 14 of the two-layered circuit 15 in an almost vertical direction as particularly shown in FIG. 2. More specifically, the engagement click 18 of the connector 17 is fitted in the engagement hole 16 on the other side as shown in a one-dotted chain line in FIG. 1. The connector 17 is positioned and fixed to the two-layered circuit 15. Thus, the legs 26 and 27 of the terminals 20 and 21 are flexed and deformed elastically and the ends of the legs come in contact with the conductive materials 11 and 12 exposed to the exposure windows 13 and 14 by pressure or elastically to achieve electrical connection. Thus, the flat circuit device is constituted. When the connector is fitted, the exposure windows 13 and 14 are shielded from the outside through the connector housing 19.

Description will be given to a structure in which the flat circuit device is mounted on an instrument panel of an automobile. In FIG. 5, the reference numeral 36 denotes an instrument panel. The flat circuit device in which the connector 17 is fitted in the two-layered circuit 15 and integrated therewith is installed as a cantilever under the instrument panel 36. A terminal portion forming the step of the two-layered circuit 15 is set to be almost coincident with a position opposed to a fixing hole 37 provided on the instrument panel 36. An electrical device 33 to be an auxiliary machine such as a wiper motor is inserted through the fixing hole 37, for example. Consequently, a connector housing 38 is fixed with a fastening tool such as a bolt, a screw or the like. At this time, the terminals 34 and 35 are inserted into and come in contact with the female terminals 20 and 21 on the connector 17 side by pressure, and are electrically conducted. The reference numeral 39 denotes a screw for fixing the electrical device 33 to the instrument panel 36.

According to the connector 17 of the present embodiment, the terminals 20 and 21 having different leg lengths are inserted in the housing 19 of the connector 17 through the elastic deformation of the lances 22 and 23. Consequently, it is easy to obtain the connector 17 for the flat circuit device.

According to the flat circuit device of the present embodiment, moreover, the legs 26 and 27 of the terminals 20 and 21 directly come in contact with the conductive materials 11 and 12 by pressure with another part such as the conductive material 5 interposed therebetween differently from the conventional device. Consequently, connection to the lower flat circuit 9 as well as the upper flat circuit 8 can be carried out easily and reliably. Furthermore, it is possible to obtain a flat circuit device having an enhancement in connecting reliability.

In the case in which the flat circuit device according to the present embodiment is mounted in a vehicle, the two-layered circuit 15 is supported and fixed like a cantilever to the instrument panel 36 as shown in FIG. 5. Therefore, when the housing 38 of the electrical device 33 to be inserted through the fixing hole 37 is to be fitted and fixed into the housing 19 of the connector 17, the two-layered circuit 15 is slightly flexed like the cantilever. Therefore, even if the connector housing 38 is pressed to be fitted completely, the two-layered circuit 15 itself can be prevented from being damaged or broken. Moreover, it is possible to prevent a fixing portion 40 of the two-layered circuit 15 or the instrument panel 36 corresponding thereto from breaking away or being damaged.

Furthermore, the electrical device can easily be attached to the two-layered circuit 15 by simple insertion of the device in the fixing hole 37. Therefore, workability can be enhanced.

A door trim or an internal door plate may be provided as a body component in place of the instrument panel and a material thereof is not restricted.

Figure 6:
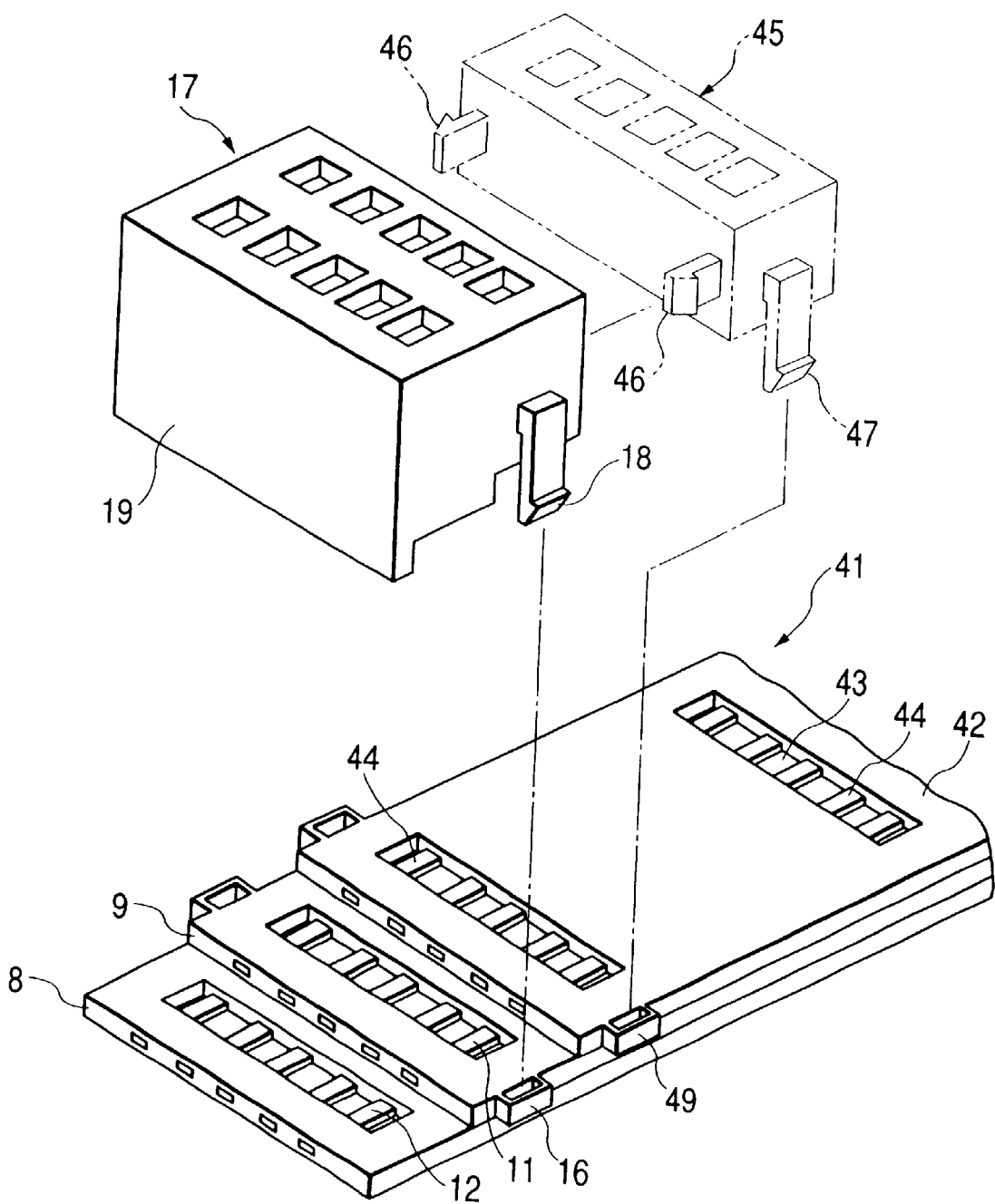
FIG. 6 is an exploded view showing an appearance according to a variant of the first embodiment.

While the flat circuit has been described as the two-layered circuit 15, a three-layered circuit, which will be hereinafter referred to as a three-layered circuit 41, may be provided as in a variant shown in FIG. 6. In this case, a flat circuit device can be obtained by additionally fitting a separate connector 45 accommodating substantially the same terminal as that used in the structure 17 in a conductive material 44 of an exposure window 43 of an uppermost flat circuit 42. More specifically, a connection click 46 provided on the separate connector 45 is fitted in a predetermined connection hole formed on the connector 17 not shown and is integrated therewith. As shown in a one-dotted chain line of FIG. 6, then, the engagement click 18 of the integrated connector is fitted in the engagement hole 16 and a connection click 47 is fitted in a connection hole 49. Thus, the connectors 17 and 45 having the integral structure are fitted in the three-layered circuit 41 in a predetermined position in an almost vertical direction.

According to the variant, a third layer can be attached to the three-layered circuit 41 by additionally integrating the separate connector 45. In other words, it is not necessary to prepare a connector corresponding to each of circuits having different number of stacked layers. Consequently, a cost can be reduced advantageously. Moreover, the connector 17 itself can have a divided structure.

Figure 7:
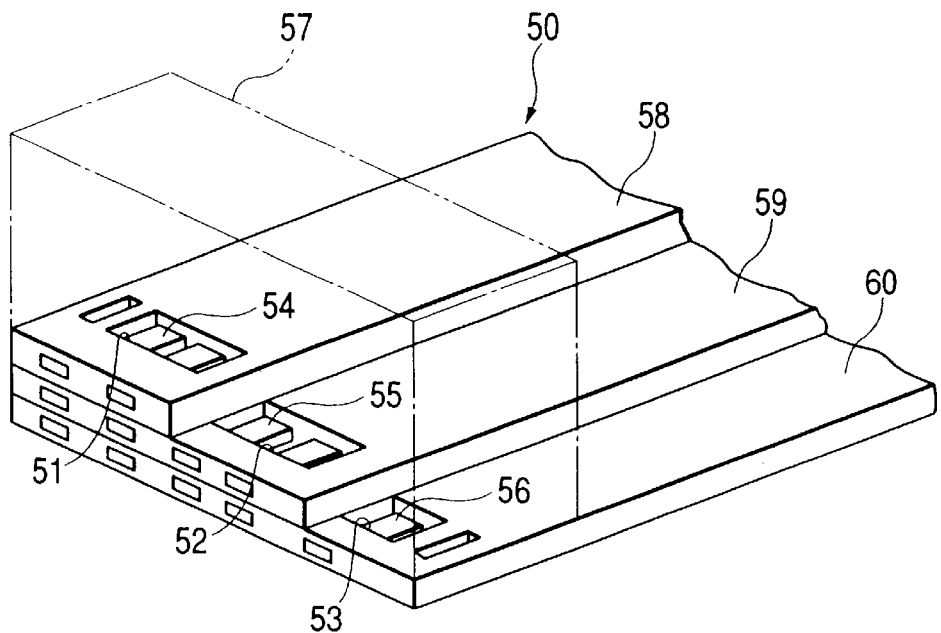
FIG. 7 is a schematic view showing an appearance according to another variant of the first embodiment.

As in another variant shown in FIG. 7, it is a matter of course that a connector 57 may be formed on a multilayered flat circuit 50 provided with flat circuits 58, 59 and 60 having different widths and may be connected to conductive materials 54, 55 and 56 of exposure windows 51, 52 and 53 formed on stepped ends.

While the present embodiment has been specifically described in detail, the specific structure is not restricted thereto but a design can be variously changed without departing from the scope of the invention.

For example, while the case in which the flat circuit has two layers or three layers has been described above, a multilayered flat circuit having four layers or more may be used. Moreover, although the flat circuit has a resin buried structure, it may be coated with a film. Furthermore, while the exposure windows 13 and 14 are formed through the upper and lower surfaces of the flat circuits 8 and 9, the exposure window maybe formed on one of the surfaces. Moreover, although the connector 17 has such a structure that legs 26 and 27 are provided in contact with the exposed conductive materials 11 and 12 by pressure, they may be previously connected to the conductive material through thermal welding and the housing 19 may be inserted later to constitute the connector 17. Furthermore, the conductive materials 11 and 12 may have circular sections.

As described above, according to the flat circuit device of the invention, a connector is fitted and connected, in an almost vertical direction, into a flat-shaped flat circuit in which a conductive material is wired in parallel and is buried with an insulating material, the flat circuit has at least two layers provided thereon, a step is formed on an end of the flat circuit having two or more layers, an exposure window is provided on the flat circuit in the vicinity of the step and the conductive material is exposed to an outside, and a metal terminal of the connector is electrically connected to the conductive material exposed to an inside of the exposure window through the fitting of the connector. Therefore, the flat circuits having second and succeeding layers in the multilayered flat circuits can directly implement electrical connection without another part such as electricity provided therebetween. Consequently, it is possible to obtain the effect that connecting reliability can be enhanced.

A plurality of metal terminals are accommodated in a connector housing and an end of the metal terminal has a length varied corresponding to the step. Therefore, the terminal of the multilayered flat circuit can easily be attached to the stepped portion so that workability can be improved.

The connector housing is formed such that an end face opposed to the step of the flat circuit is step-shaped corresponding to the step. Therefore, it is possible to obtain the effect that the connector can stably be fitted in the multilayered flat circuit.

The metal terminal of the connector housing has an end formed elastically deformably and the metal terminal elastically comes in contact with the conductive material exposed to the inside of the exposure window against spring force of the metal end during the fitting of the connector. Therefore, it is possible to obtain the effect that sure connecting reliability can be obtained.

The end of the metal terminal of the connector housing is welded and connected to the conductive material exposed to the inside of the exposure window. Therefore, it is possible to obtain the effect that sure connecting reliability can be obtained.

The connector is constituted such that the-connector housing is divided corresponding to the flat circuit and the connector housing corresponding to the step of the multilayered flat circuit is integrated to be fitted in the flat circuit. Consequently, it is possible to integrate predetermined connector housings with each other corresponding to the number of the stacked layers of the flat circuit and to fit them in the flat circuit. Furthermore, it is not necessary to previously prepare different kinds of connectors. Correspondingly, it is possible to obtain the good effect that a cost can be reduced advantageously.

Second Embodiment

A second embodiment of the invention will be described below with reference to FIGS. 8 to 13.

Figure 8:
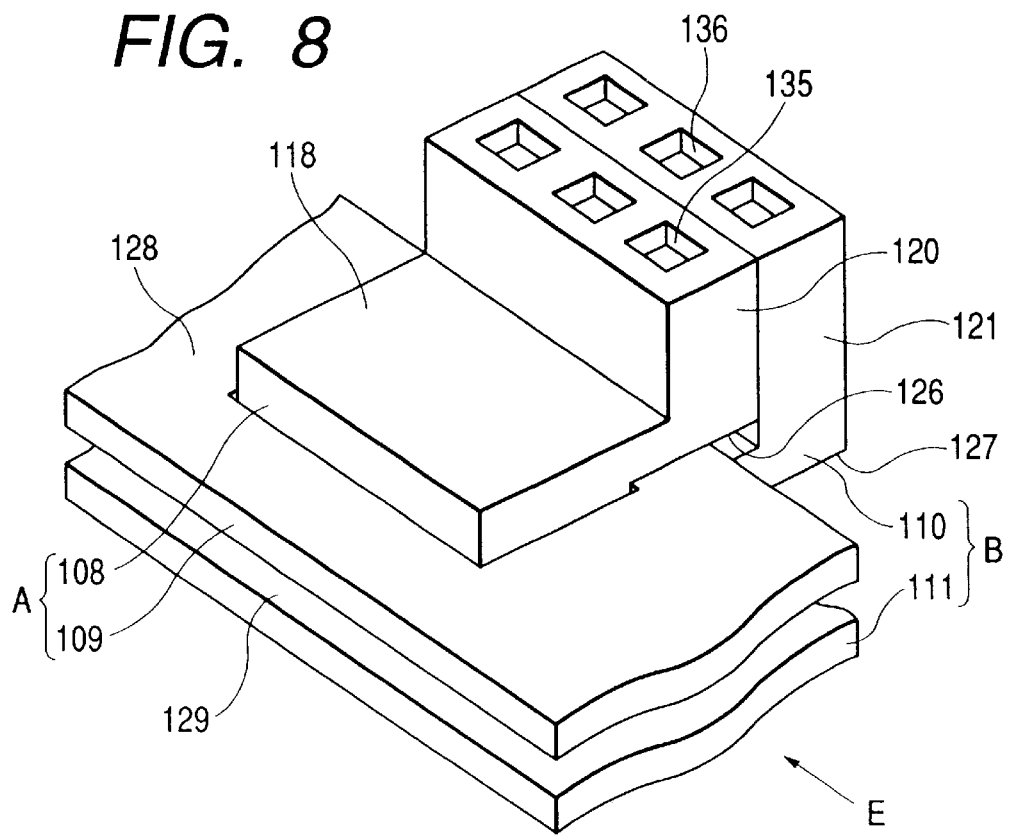
FIG. 8 is a perspective view showing the schematic appearance of a connecting device for a flat circuit according to a second embodiment of the invention.

In the schematic structure shown in FIG. 8, a connecting device for a flat circuit includes an upper flat circuit A and a lower flat circuit B. The upper flat circuit A has a first connector housing 108 attached to a first flat circuit 109. The lower flat circuit B having a second connector housing 110 attached to a second flat circuit 111. In a position where the connector housings 108 and 110 are almost coincident with each other in a vertical direction, the upper and lower flat circuits A and B are integrated with each other through a connecting mechanism (which will be described below).

Figure 9:
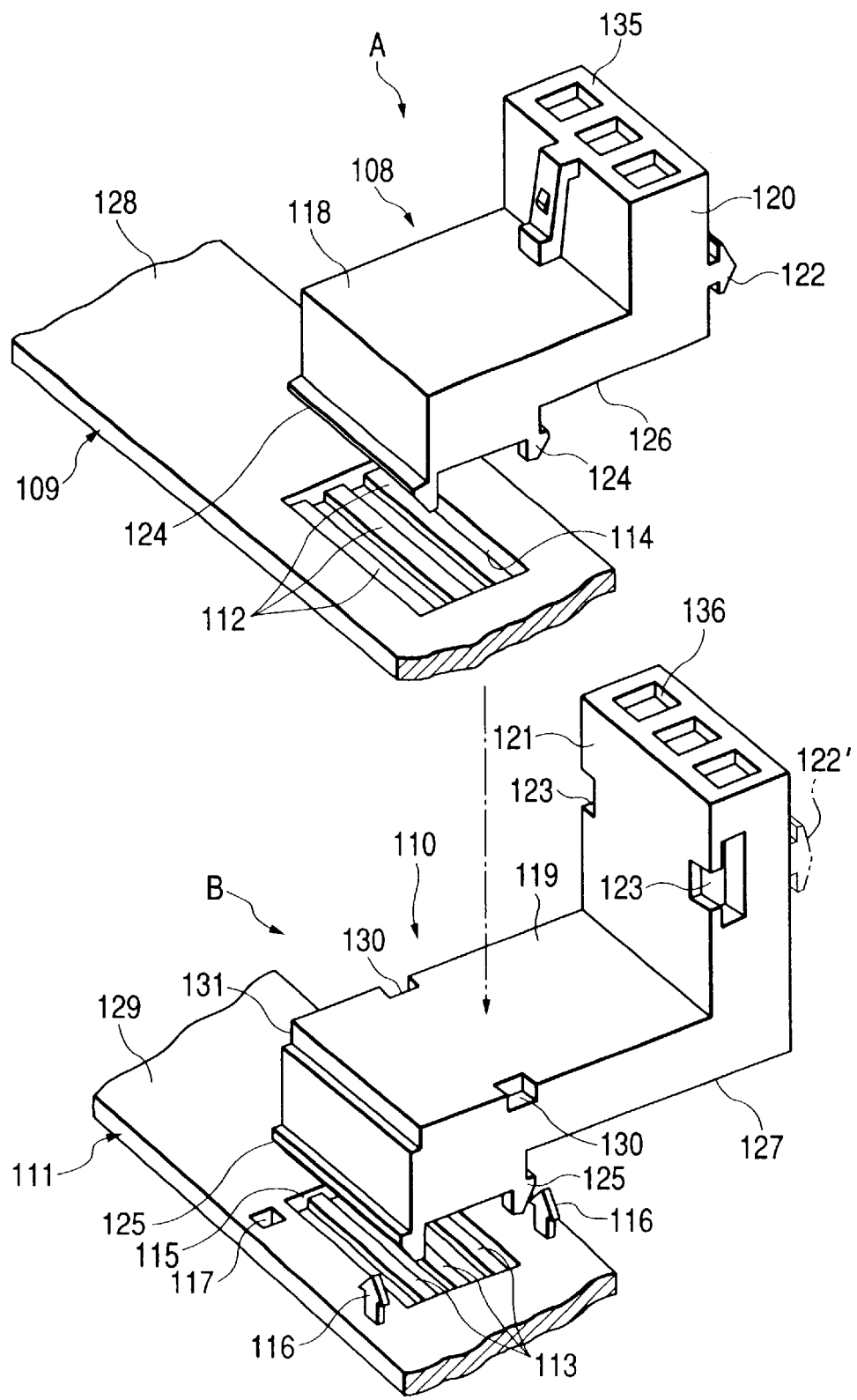
FIG. 9 is an enlarged perspective view showing an appearance in the exploded state of the connecting device for the flat circuit illustrated in FIG. 8.
Figure 12:
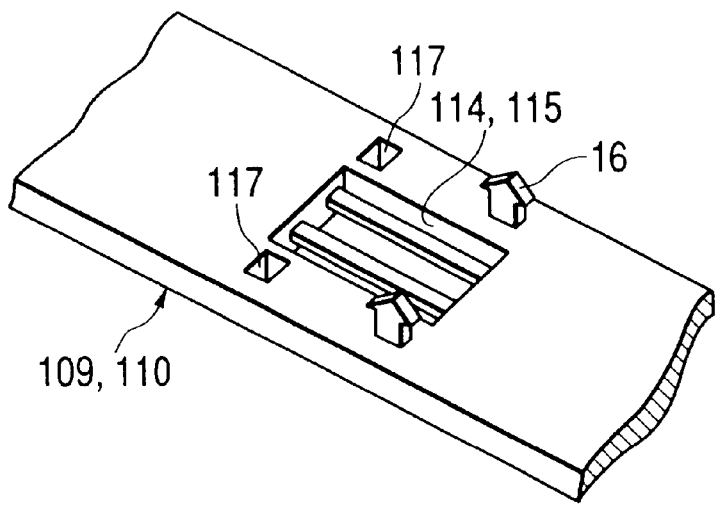
FIG. 12 is a perspective view showing the appearance of one connecting mechanism formed on one face side of the flat circuit.

In FIG. 9, the first and second flat circuits 109 and 111 are provided with conductors or conductive materials 112 and 113 to be circuit conductors wired in parallel and buried with an insulating material, and are flat and elongated shaped. Rectangular exposure windows 114 and 115 penetrating longitudinally to expose electricities 112 and 113 to the outside are formed in the middle portions of the circuits 109 and 111. An engagement projection 116 and an engagement hole 117 are formed on the peripheral edge of each of the exposure windows as shown in FIG. 12. The engagement projection 116 is fitted to the engagement hole provided on the other flat circuit for integrating each of the upper and lower flat circuit 109 and 111 to be the connecting mechanism.

The connector housings 108 and 110 will be described below. The housings 108 and 110 have different sizes, and have similar L-shapes seen from a side surface. More specifically, there are provided base portions 118 and 119 and vertical wall portions 120 and 121 erected and bent like an a L-shape with respect to the base portions. Lock portions 122 and 122 formed on the right wall surface of the vertical wall portion 120 are engaged with a locking engagement groove 123 as a locked portion which is formed on the left wall surface of the vertical wall portion 121. Consequently, both vertical wall portions 120 and 121 are connected to each other. Thus, the connecting mechanism for connecting the connector housings 108 and 110 is formed.

Figure 11:
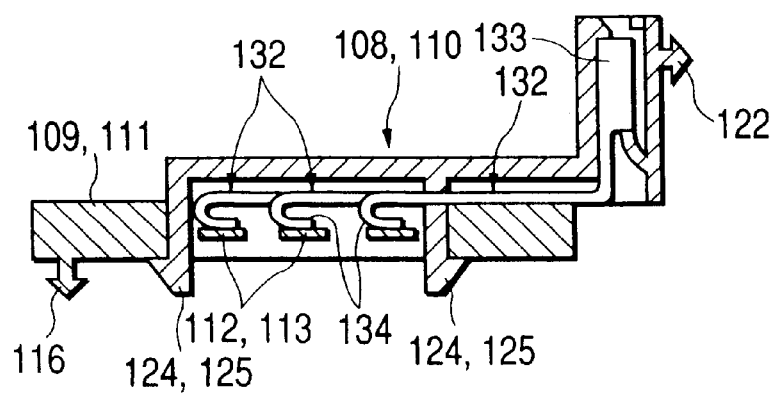
FIG. 11 is a sectional view showing the connecting relationship between the flat circuit and a connector housing.

As shown in FIG. 11, both the first and second connector housings 108 and 110 are provided with fitting clicks 124 and 125 to be fitted in the peripheral edges of the exposure windows 114 and 115 of the flat circuits 109 and 111, respectively. When the fitting clicks 124 and 125 are fitted in the exposure windows 114 and 115 respectively, the first connector housing 108 is attached to the first flat circuit 109 so that the upper flat circuit A is constituted, and the second connector housing 110 is attached to the second flat circuit 111 so that the lower flat circuit B is constituted. At this time, lower surfaces 126 and 127 of the housings 108 and 110 are seated on upper surfaces 128 and 129 forming the flat planes of the flat circuits 109 and 111, respectively. The base portion 119 of the second connector housing 110 is provided with recess portions 130 and 131 such that the fitting click 124 of the first connector housing 108 does not interfere with the base portion 119. A locking click for connecting other connector housings is shown.

Figure 13:
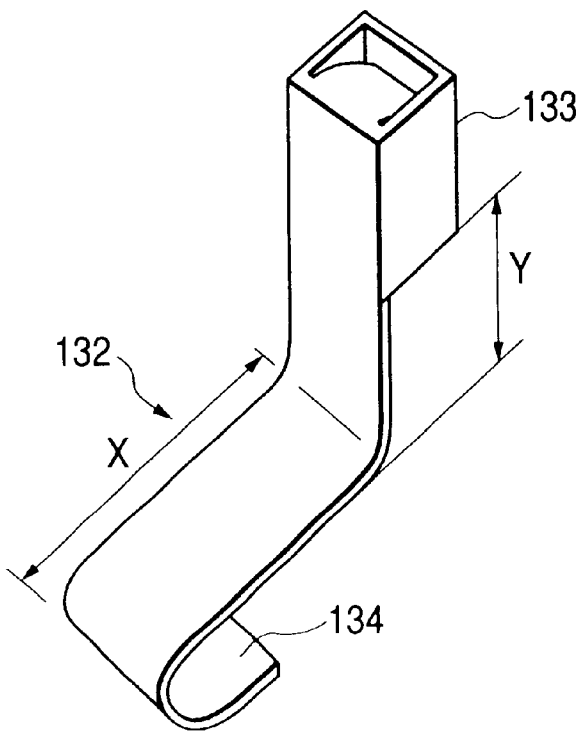
FIG. 13 is an enlarged perspective view showing the appearance of a metal terminal to be used for the connector housing.
Figure 14:
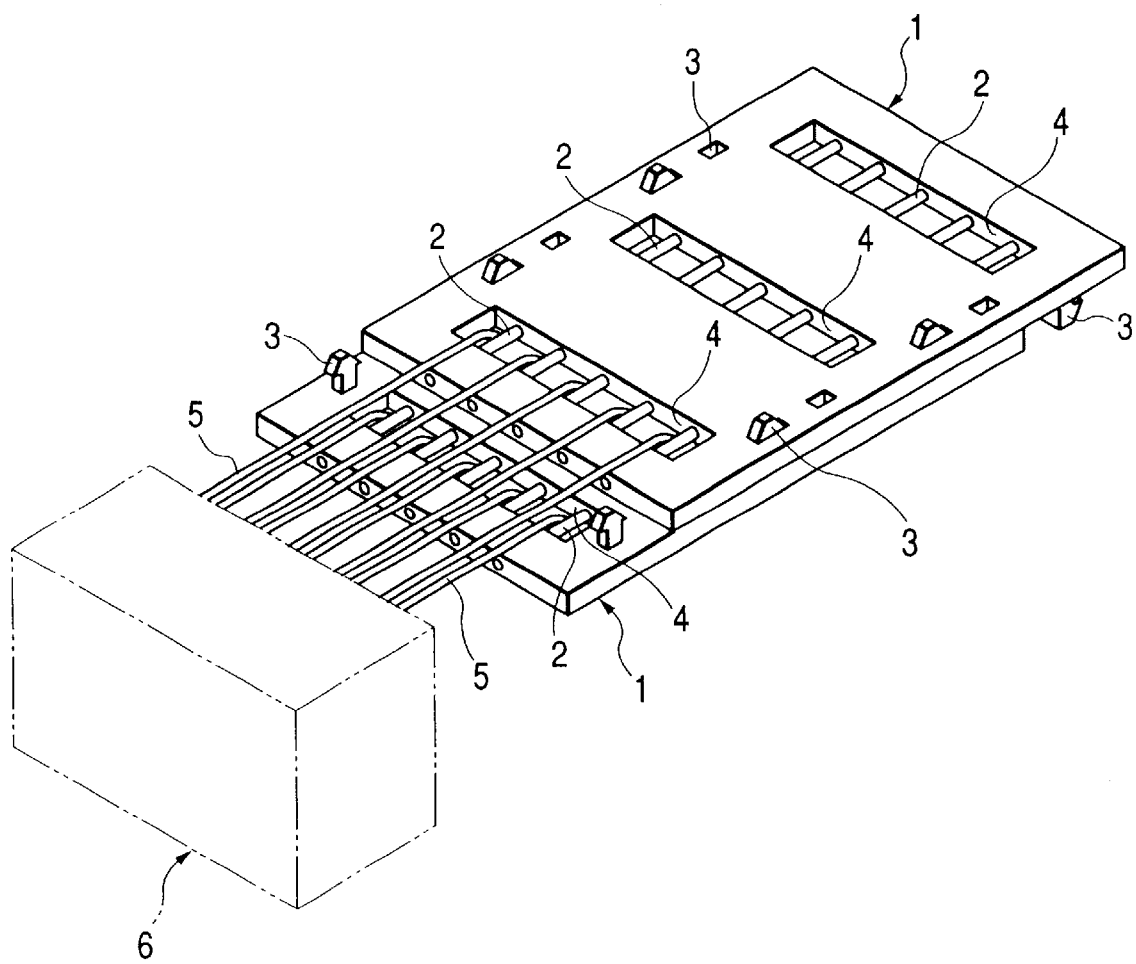
FIG. 14 is a view showing the appearance of a conventional device.

In FIGS. 11 and 13, metal terminals 132 are accommodated in the connector housings 108 and 110. Each terminal 132 has a female terminal portion 133 and a U-shaped contact 134. A terminal C' of an auxiliary machine C as a mate circuit is fitted into the female terminal portion 133. The U-shaped contact 134 has a free end bent like a U-shape and is connected to the female terminal portion through a center bent formed almost L-shaped. The terminal 132 has different X and Y dimensions depending on which flat circuit of which layer is to be used. For example, the X dimension is determined depending on which circuit conductor, that is, a conductor or conductive material from the side surface of the flat circuit is used for connection. Moreover, the Y dimension is determined which connector housing from the top is to be used. When the upper and lower flat circuits A and B are constituted, the connector housings 108 and 110 hold the flat circuits 109 and 111 between the lower surfaces 126 and 127 and the free end 134 of the terminal 132. Consequently, the connector housings 108 and 110 are connected to the conductors or conductive materials 112 and 113 of the flat circuit in contact or by pressure.

Figure 10:
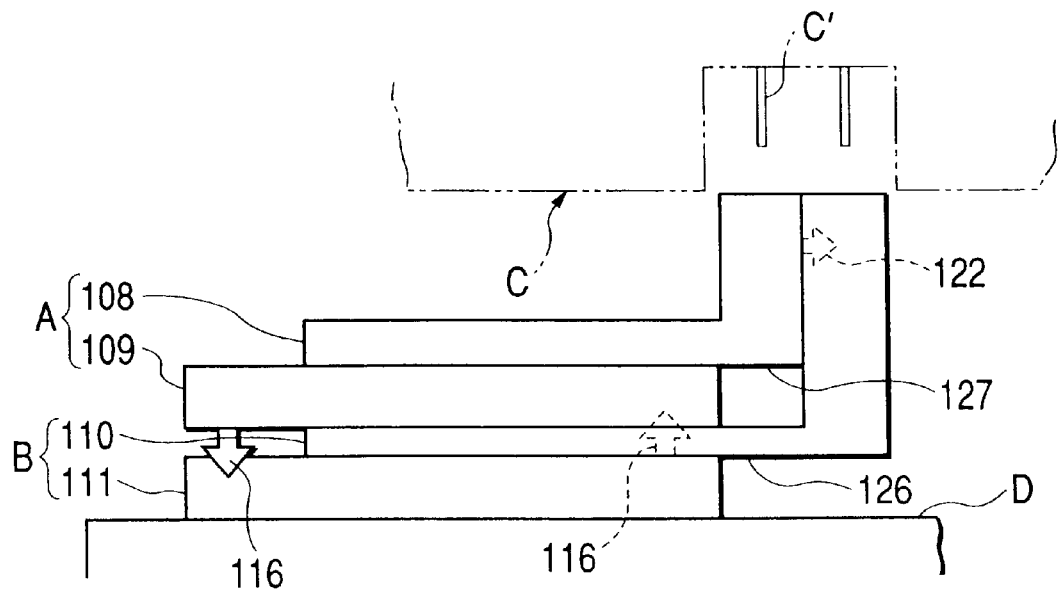
FIG. 10 is a view typically showing the sectional state of the connecting device for the flat circuit seen in an arrow E of FIG. 8.

In order to integrate the upper flat circuit A having the above-mentioned structure with the lower flat circuit B, the engagement projection provided on the lower surface side of the upper flat circuit A is correspondingly connected to the engagement hole 117 formed on the lower flat circuit B, and the engagement projection 116 of the lower flat circuit B is correspondingly connected to the engagement hole on the lower surface side of the circuit A. At the same time, the locking portion 122 of the first connector housing 108 is engaged with the locking engagement groove 123. Consequently, the upper and lower flat circuits A and B can be connected completely as shown in FIGS. 8 and 10. Thus, the connecting device for the flat circuit obtained as shown in FIG. 8 is attached and fixed to a housing D by appropriately using an adhesive or a clip. Consequently, the terminal C' for another auxiliary machine C can be inserted and fitted in the fitting holes 135 and 136 for terminals which are provided on the upper ends of the vertical wall portions 120 and 121 as shown in FIG. 10.

According to the embodiment, the following functions and effects can be obtained. More specifically, the second connector housing 110 is directly fitted in the exposure window 115 of the second flat circuit 111 without using the circuit such as a conductor or conductive material in the lower flat circuit B. Consequently, the circuit can be caused to branch in the middle of the second flat circuit 111 very easily. Thus, it is possible to obtain a connecting device for a flat circuit having fewer connecting portions and improved connecting reliability. Moreover, the fitting holes 135 and 136 for the terminal of the equipment on the other side are protruded outward from the side surface of the flat circuit. Thus, the auxiliary machine C can be attached easily. The upper and lower flat circuits A and B can be integrated with each other reliably and strongly through the connecting mechanism including the engagement projection 116 and engagement hole 117 and the locking portion 122 and locking engagement hole 123.

While the present embodiment has been specifically described in detail, the specific structure is not restricted thereto but a design can be variously changed without departing from the scope of the invention.

For example, although the vertical wall portions 120 and 121 of the connector housings 108 and 111 are formed in the almost vertical direction with respect to the base portions 118 and 119, they may be inclined at a proper desired angle with respect to the flat surfaces of the flat circuits 109 and 111 or the base portions 118 and 119. Consequently, the degree of freedom is increased in such a direction that terminals of other auxiliary machines are fitted in the fitting holes 135 and 136 for terminals so that a working efficiency can be enhanced correspondingly. Moreover, while the case in which the flat circuits 109 and 111 are two-layered has been described, a multilayered flat circuit having more layers may be used. Although the flat circuit is a resin buried structure, it may be coated with a film. Furthermore, while the exposure windows 114 and 115 are formed through the upper and lower surfaces of the flat circuits 109 and 111, it is apparent that the exposure window may be formed on one of the surfaces. Moreover, the conductors or conductive materials 112 and 113 to be the circuit conductive materials may have circular sections. While the engagement projection 116 and engagement hole 117 and the locking portion 122 and locked portion 123 form the connecting mechanism for integrating the upper and lower flat circuits A and B, the flat circuits A and B may be connected through a proper clip member.

As described above, according to the connecting device for a flat circuit in accordance with the invention, the flat circuit is multilayered to have two or more layers and a terminal of the connector housing is individually connected to the conductor or conductive material exposed through the exposure window formed for each layer of the flat circuit, and the flat circuit of each layer having the connector housing attached thereto is further integrated by the connecting mechanism. Therefore, an electric circuit can easily branch also in the middle of the lower flat circuit. In addition, the number of electric nodes is small. Consequently, it is possible to obtain the connecting device for the flat circuit having excellent connecting reliability.

The connector housing is protruded outward from a side surface of the flat circuit and is provided such that a fitting portion on the other side capable of being connected to a circuit on the other side is exposed to a protruded end. Therefore, in the case in which the connector housing is to be connected to auxiliary machines on the other side or the circuit, the connecting device for the flat circuit is not impeded. Consequently, it is possible to obtain the effect that a work for connection to the auxiliary machines can easily be carried out.

The connecting mechanism is provided on the flat circuit. Therefore, the flat circuits can be connected strongly to each other. Correspondingly, it is possible to obtain a connecting device for a flat circuit having excellent connecting reliability.

The connecting device is also provided in the connector housing. Therefore, the flat circuit having the upper connector housing fitted therein and the flat circuit having the lower connector housing fitted therein can be reliably integrated with each other without separation. Thus, it is possible to obtain the effect that the connecting reliability can be more enhanced.

The protruded end of the connector housing is formed to have an inclination with respect to the flat face of the flat circuit. Consequently, it is possible to properly employ a connector housing having an inclination corresponding to a direction in which the terminal of the circuit on the other side can be inserted, and furthermore, it is possible to obtain the effect that a work for connecting the circuit on the other side can easily be carried out.

What is claimed is:

1. A flat circuit device comprising:
   at least two flat-shaped flat circuits superposed on each other to form layers of said flat circuits, each of said at least two flat circuits including parallel conductors embedded into an insulating material, an exposure window formed adjacent to an end of each of said at least two flat circuits, each exposure window exposing said conductors, said ends of said at least two flat circuits positioned offset relative to each other to expose each said exposure window; and
   a connector including a plurality of terminals, said connector being fitted to said at least two flat circuits in a direction substantially perpendicular to said at least two flat circuits and connecting respective ones of said plurality of terminals to corresponding ones of said conductors provided at each of said at least two flat circuits.

2. A flat circuit device according to claim 1, wherein each of said at least two flat circuits are adhered to each other.

3. A flat circuit device according to claim 2, wherein said connector is provided with an engagement click, each of said at least two flat circuits is provided with an engagement hole engageable with said engagement click.

4. A flat circuit device according to claim 1, wherein a step portion is defined by said ends of said at least two flat circuits positioned offset relative to each other.

5. A flat circuit device according to claim 4, wherein said connector comprises a connector housing, said plurality of terminals are accommodated in said connector housing, and an end of each of said terminals has a length corresponding to said step portion.

6. A flat circuit device according to claim 5, wherein at least two of said connectors are provided at said at least two said flat circuits, said connectors are combined together and commonly fitted to said at least two flat circuits.

7. A flat circuit device according to claim 5, wherein a lower end face of said connector housing opposed to said step portion is formed in a step-shape corresponding to said step portion.

8. A flat circuit device according to claim 7, wherein said end of each of said terminals is formed elastically deformably, each of said terminals elastically contacts with said conductors against the spring force of said terminal during the fitting of said connector housing.

9. A flat circuit device according to claim 7, wherein said end of each of said terminals is welded and connected to said conductor.

10. A flat circuit device according to claim 7, wherein an upper end surface of said connector housing opposite to said lower end surface relative to said connector housing is provided with a terminal of an electrical device to connect said terminal to said mating terminal.

11. A flat circuit device comprising:
    at least two flat circuits, each of said at least two flat circuits formed in flat-shape including parallel conductors embedded into an insulating material and an exposure window for exposing said conductors; and
    at least two connector housings, each of said connector housings attached to said at least two flat circuits and accommodating terminals directly connected to said conductors, wherein said at least two flat circuits are attached to each other and to said at least two connector housings which are attached to each other by a connecting mechanism.

12. A flat circuit device according to claim 11, wherein each of said connector housings protrudes outward from a side surface of said at least two flat circuits and is provided with a fitting portion on a protruded end of said connector housing so that said fitting portion is capable of being connected to a mating circuit.

13. A flat circuit device according to claim 12, wherein said connecting mechanism is formed by a locking portion provided in said connector housing and a locked portion provided in an adjacent connector housing and fitted to said locking portion.

14. A flat circuit device according to claim 12, wherein each of said fitting portions includes a terminal fitting hole adapted to be inserted with a mating terminal of said mating circuit to connect said terminal to said mating terminal.

15. A flat circuit device according to claim 12, wherein said terminals fitting holes are positioned on a common plane.

16. A flat circuit device according to claim 12, wherein said connecting mechanism is formed by an engagement projection provided on a first one of said at least two flat circuits and an engagement hole provided on a second one of said at least two flat circuits and fitted to said engagement projection.

17. A flat circuit device according to claim 16, wherein said connecting mechanism is formed by a locking portion provided in said connector housing and a locked portion provided in an adjacent connector housing and fitted to said locking portion.

18. A flat circuit device according to claim 12, wherein said protruded end is set to be placed in a position which said protruded end is bent at a predetermined angle with respect to a flat face of said flat circuit.

19. A flat circuit device according to claim 18, wherein said predetermined angle is substantially 90 degrees.

* * * * *